United States Patent
Yilmaz

(10) Patent No.: US 11,824,090 B2
(45) Date of Patent: Nov. 21, 2023

(54) BACK SIDE DOPANT ACTIVATION IN FIELD STOP IGBT

(71) Applicant: iPower Semiconductor, Gilroy, CA (US)

(72) Inventor: Hamza Yilmaz, Gilroy, CA (US)

(*) Notice: Subject to any disclaimer, the term of this patent is extended or adjusted under 35 U.S.C. 154(b) by 165 days.

(21) Appl. No.: 17/353,444

(22) Filed: Jun. 21, 2021

(65) Prior Publication Data

US 2021/0313423 A1 Oct. 7, 2021

Related U.S. Application Data

(62) Division of application No. 16/440,696, filed on Jun. 13, 2019, now abandoned.

(Continued)

(51) Int. Cl.
*H01L 21/225* (2006.01)
*H01L 21/265* (2006.01)
(Continued)

(52) U.S. Cl.
CPC .... *H01L 29/0834* (2013.01); *H01L 21/02532* (2013.01); *H01L 21/02576* (2013.01);
(Continued)

(58) Field of Classification Search
None
See application file for complete search history.

(56) References Cited

U.S. PATENT DOCUMENTS

| | | | |
|---|---|---|---|
| 4,941,026 A | 7/1990 | Temple | |
| 5,168,331 A | 12/1992 | Yilmaz | |

(Continued)

FOREIGN PATENT DOCUMENTS

| | | | |
|---|---|---|---|
| CN | 103392224 A | 11/2013 | |
| CN | 103489775 A | 1/2014 | |

(Continued)

OTHER PUBLICATIONS

PCT App. No. PCT/US2019/044510, "International Search Report" and "Written Opinion of the International Search Authority," dated Nov. 21, 2019, 13 pages.

(Continued)

*Primary Examiner* — Jay C Chang
(74) *Attorney, Agent, or Firm* — David T. Millers

(57) ABSTRACT

A field stop insulated gate bipolar transistor (IGBT) fabricated without back-side laser dopant activation or any process temperatures over 450° C. after fabrication of front-side IGBT structures provides activated injection regions with controlled dopant concentrations. Injection regions may be formed on or in a substrate by epitaxial growth or ion implants and diffusion before growth of N field stop and drift layers and front-side fabrication of IGBT active cells. Back-side material removal can expose the injection region(s) for electrical connection to back-side metal. Alternatively, after front-side fabrication of IGBT active cells, back-side material removal can expose the field stop layer (or injection regions) and sputtering using a silicon target with a well-controlled doping concentration can form hole or electron injection regions with well-controlled doping concentration.

9 Claims, 12 Drawing Sheets

Related U.S. Application Data

(60) Provisional application No. 62/739,813, filed on Oct. 1, 2018.

(51) Int. Cl.

| | | |
|---|---|---|
| *H01L 21/285* | (2006.01) | |
| *H01L 21/02* | (2006.01) | |
| *H01L 21/304* | (2006.01) | |
| *H01L 21/306* | (2006.01) | |
| *H01L 21/308* | (2006.01) | |
| *H01L 21/311* | (2006.01) | |
| *H01L 29/08* | (2006.01) | |
| *H01L 29/66* | (2006.01) | |
| *H01L 29/06* | (2006.01) | |
| *H01L 29/10* | (2006.01) | |
| *H01L 29/40* | (2006.01) | |
| *H01L 29/739* | (2006.01) | |

(52) U.S. Cl.
CPC .... *H01L 21/02631* (2013.01); *H01L 21/2253* (2013.01); *H01L 21/26513* (2013.01); *H01L 21/2855* (2013.01); *H01L 21/304* (2013.01); *H01L 21/308* (2013.01); *H01L 21/30604* (2013.01); *H01L 21/30625* (2013.01); *H01L 21/31111* (2013.01); *H01L 21/31144* (2013.01); *H01L 29/063* (2013.01); *H01L 29/0623* (2013.01); *H01L 29/0638* (2013.01); *H01L 29/1095* (2013.01); *H01L 29/407* (2013.01); *H01L 29/66348* (2013.01); *H01L 29/7397* (2013.01)

(56) References Cited

U.S. PATENT DOCUMENTS

| | | | |
|---|---|---|---|
| 5,702,961 | A | 12/1997 | Park |
| 5,998,833 | A | 12/1999 | Baliga |
| 6,323,509 | B1 | 11/2001 | Kusunoki |
| 7,489,011 | B2 | 2/2009 | Yilmaz |
| 7,645,659 | B2 | 1/2010 | Yun et al. |
| 8,283,213 | B2 | 10/2012 | Bobde et al. |
| 9,620,630 | B2 | 4/2017 | Bobde et al. |
| 9,685,335 | B2 | 6/2017 | Lee et al. |
| 9,748,375 | B2 | 8/2017 | Yilmaz et al. |
| 9,852,910 | B2 | 12/2017 | Yilmaz |
| 2002/0117712 | A1 | 8/2002 | Matsudai et al. |
| 2010/0301335 | A1* | 12/2010 | Ryu .................. H01L 29/0834 257/77 |
| 2010/0314659 | A1 | 12/2010 | Yilmaz et al. |
| 2010/0327313 | A1 | 12/2010 | Nakamura |
| 2011/0204413 | A1 | 8/2011 | Arai et al. |
| 2011/0227128 | A1 | 9/2011 | Hisamoto |
| 2014/0209970 | A1 | 7/2014 | Schulze et al. |
| 2015/0206789 | A1 | 7/2015 | Pappas et al. |
| 2015/0255572 | A1 | 9/2015 | Matsuura et al. |
| 2015/0287805 | A1 | 10/2015 | Zhang et al. |
| 2015/0333161 | A1 | 11/2015 | Van Treek et al. |
| 2016/0172438 | A1 | 6/2016 | Jelinek et al. |
| 2016/0300938 | A1 | 10/2016 | Tonari et al. |
| 2016/0372573 | A1 | 12/2016 | Wang et al. |
| 2017/0213908 | A1* | 7/2017 | Fursin .................. H01L 29/407 |
| 2018/0261680 | A1 | 9/2018 | Park et al. |
| 2019/0165090 | A1 | 5/2019 | Schulze et al. |
| 2019/0287961 | A1 | 9/2019 | Naito |

FOREIGN PATENT DOCUMENTS

| | | |
|---|---|---|
| CN | 104425252 A | 3/2015 |
| CN | 107275381 A | 10/2017 |
| CN | 107768433 A | 3/2018 |
| JP | 2000200906 A | 7/2000 |
| JP | 2013089874 A | 5/2013 |

OTHER PUBLICATIONS

Constapel, Rainier et al., "Trench-IGBTs With Integrated Diverter Structures," Proceedings of 1995 International Symposium on Semiconductor Devices and ICs (ISPSD), Yokohama, Japan (1995) p. 201-206.

Deng, Shengling et al., "Doping Engineering for Improved Immunity Against BV Softness and BV Shift in Trench Power MOSFET" Proceedings of the 2016 28th International Symposium on Semiconductor Devices and ICs (ISPSD) Prague, Czech Republic (2016) pp. 375-378.

Hossain, Zia et al., "3-D TCAD Simulation to Optimize the Trench Termination Design for Higher and Robust BV DSS" Proceedings of the 2016 28th International Symposium on Semiconductor Devices and ICs (ISPSD) Prague, Czech Republic (2016) pp. 391-194.

Nakamura, Katsumi et al., "Advanced Wide Cell Pitch CSTBTs Having Light Punch-Through (LPT) Structures" IEEE Pub. No. 0-7803-7318-9/02 (2002) pp. 277-280.

Nishiwaki, Tatsuya et al., "Breakdown Voltage Instability Mechanism and Improving Ruggedness in Trench Field Plate Power MOSFET" Proceedings of the 2016 28th International Symposium on Semiconductor Devices and ICs (ISPSD) Prague, Czech Republic (2016) pp. 215-218.

Nishiwaki, Tatsuya et al., "Modeling of Time Dependent Breakdown Voltage Degradation in Trench Field Plate Power MOSFET" Proceedings of the 2017 29th International Symposium on Semiconductor Devices and ICs (ISPSD) Sapporo, Japan (2017) pp. 463-466.

Oyama, K. et al., "Novel 600-V Trench High-Conductivity IGBT (Trench HIGT) With Short-Circuit Capability" Proceedings of the 2001 International Symposium on Semiconductor Devices and ICs (ISPSD) Osaka, Japan (2001) pp. 417-420.

Chinese Patent Office, English translation of the Office Action and Search Report dated Feb. 17, 2023 for counterpart Chinese Patent App. No. 201910800421.5 filed Aug. 28, 2019, 21 pages.

\* cited by examiner

BACK SIDE DOPANT ACTIVATION IN FIELD STOP IGBT

CROSS-REFERENCE TO RELATED APPLICATIONS

This patent document is a divisional and claims benefit of the earlier filing date of U.S. patent application Ser. No. 16/440,696, filed Jun. 13, 2019, which claims benefit of the earlier filing date of U.S. provisional Pat. App. No. 62/739,813, filed Oct. 1, 2018, both of which are hereby incorporated by reference in their entirety.

BACKGROUND

An insulated-gate bipolar transistor (IGBT) device generally includes a metal oxide semiconductor field effect transistor (MOSFET) that drives a wide base of a bipolar junction transistor (BJT). Vertical IGBTs have become a key power device for high current and high voltage uses, particularly for motor control and induction heating type applications. Ongoing research and development continue to try to improve the safe operation area (SOA) of IGBTs and improve efficiency and robustness of IGBTs.

Some goals for improving vertical IGBTs include reducing the forward collector-emitter voltage drop (VCE-sat) and minimizing switching losses. A major source of forward collector-emitter voltage drop is the thick lightly doped drift region between the emitter on the top surface of the device and a collector on the back side of a vertical IGBT. A field stop IGBT employs a more heavily doped field stop layer between the drift region and the collector. In an off state of the field stop IGBT, the electric field strength between the emitter and collector decreases slowly within the drift region and decreases more quickly within the more conductive field stop layer. A field stop IGBT may thus have a thinner drift layer and still withstand a given voltage in the off state, and the thinner drift layer reduces the on state resistance and the forward voltage drop (VCE-sat). The forward voltage drop (VCE-sat) of an IGBT may also be reduced by lowering the drain-source resistance (Rds) of the MOSFET that provides the base current for the vertical PNP BJT and as a result the carrier modulation of the N base of the vertical PNP BJT. MOSFET resistance Rds may be reduced by splitting current amongst multiple MOSFET cells at an upper portion of the IGBT. Unfortunately high levels of carrier modulation or carrier storage in the N base of the PNP BJT increases switching losses by slowing the turn off speed of the IGBT, which degrades the SOA of the IGBT. Another issue is that low MOSFET Rds typically results in a higher saturation and a shorter withstand time during the mode of a load short circuit, e.g., for motor drive applications. Base to emitter/source shorting of a parasitic NPN BJT as part of MOSFET is critical to prevent latch up and enhance IGBT robustness.

The doping concentrations of the P+ hole injector and the N field stop or N buffer regions of an IGBT may be used to control injection efficiency of the MOSFET into the base of the vertical BJT of the IGBT. Therefore, controlling the doping concentration of a P-type hole injection region that is connected to the collector electrode and an N buffer region can be critical to IGBT device performance. Several types P-type hole injection structures are used in different IGBT designs. Punch through type IGBT structures generally use a P+ substrate wafer with an N buffer region and an N− drift region epitaxially grown on the P+ substrate. However, the doping concentrations in P+ wafers are generally not well controlled. To reduce doping concentration variations for P-type hole injection and N field stop regions, after completion of IGBT front side wafer processing, the back side of a wafer may be ground and ion implanted with phosphorous or hydrogen to form an N field stop region and with boron to form a P-type hole injection region. A dopant activation process (e.g., annealing) is generally required to remove defects formed during ion implantation and to activate implanted phosphorous impurities to become N-type dopants and implanted boron impurities to become P-type dopants in crystalline silicon. Even in cases where an N field stop with the desired dopant concentration is formed during the N-type epitaxial growth and only boron is implanted from the back side of the thinned IGBT wafers, activation of boron impurities to form P-type hole injection regions is still required.

The activation process may be problematic for structures on the front side of the wafer. In particular, during the back side processes, the temperature at the front side of the wafer may need to remain below 450° C. (or even lower for aluminum only front side metal) to prevent aluminum from metal layers from spiking into adjacent silicon and damaging front-side structures, particularly at a P body junction of the IGBT. To keep the front-side temperature low (e.g., below 450° C.), a laser annealing tool may be used, but laser annealing tools are expensive. Alternatively, a low temperature furnace annealing around 450° C. may be used, but at this low temperature, only a small fraction of the implanted boron impurities are activated to act as P-type dopants.

Several different field stop IGBT structures and fabrication methods have been proposed or implemented. U.S. Pat. No. 7,645,659, entitled "Power semiconductor device using silicon substrate as field stop layer and method of manufacturing the same," for example, discloses fabrication of Field Stop IGBTs by growing an N− epitaxial layer on an N substrate, which is thinned and serves as an N-type field stop. U.S. Pat. No. 9,685,335, entitled "Power device including a field stop layer" describes using epitaxial growth to form double field stop regions in an IGBT. U.S. Pat. No. 9,852,910, entitled "Vertical power transistor with dual buffer regions" discloses a field stop IGBT structure with dual N buffer (Field Stop) regions including N+ islands formed on a substrate. U.S. Pat. No. 8,283,213, entitled "Method of minimizing field stop insulated gate bipolar transistor (IGBT) buffer and emitter charge variation" proposes a method of manufacturing a vertical field stop IGBT by growth of an N field stop and N− epitaxial layers on a lightly doped substrate. Another method of manufacturing a vertical field stop IGBT disclosed in U.S. Pat. No. 9,620,630, entitled "Injection control in semiconductor power devices" grows multiple epitaxial layers including a P-type epitaxial layer and boron implantation into a P epitaxial layer overlying a lightly doped substrate. All these fabrication methodologies for field stop IGBTs require back side ion implantation and activation by either furnace or laser annealing.

SUMMARY

In accordance with an aspect of the invention, a variety of field stop and thin IGBT structures and fabrication processes do not require high-temperature or laser activation of impurities implanted in the back side of a wafer after front side processing. Back side processes may particularly be conducted at temperatures below 450° C., below 400° C., or even at lower temperatures.

BRIEF DESCRIPTION OF THE DRAWINGS

The drawings illustrate examples for the purpose of explanation and are not of the invention itself. Use of the same reference symbols in different figures indicates similar or identical items.

DETAILED DESCRIPTION

A vertical field stop IGBT can include a field stop and/or one or more P-type hole injector regions formed and activated without back side laser activation. The back side structure of an IGBT may be critical for carrier injection efficiency and switching performance and also critical to integrating a Fast Recovery Diode (FRD) with an IGBT to eliminate the need for an external FRD in parallel with the IGBT in inductive load type applications. An integrated FRD and IGBT structure may be referred to as a reverse conducting (RC) IGBT. An RC IGBT can show negative resistance effect in collector emitter current-voltage (I-V) characteristics which can create undesirable effects if dopant concentrations are not specifically designed and controlled to minimize or prevent the effects.

In one exemplary implementation, a field stop and/or one or more P-type hole injection regions are formed in or on a top surface of a substrate before an epitaxial drift region is grown and front-side structure is fabricated. After the front-side structure is fabricated, wafer grinding or etching of the back side of the substrate may expose bottoms of the one or more P-type hole injection regions and a back-side collector electrode may be fabricated in contact with the field stop or the P-type hole injector regions. In an alternative implementation, after the front-side structure is fabricated, wafer grinding or etching of the back side of the substrate may expose the field stop layer or a deepest segment of the drift region, and a sputtering process may form one or more P-type hole injection regions or the field stop layer on a back side of the wafer. With either implementation, annealing or laser activation of impurities on a back side of the waver is avoided, while field stop and hole injection regions with tightly controlled dopant concentrations may be fabricated.

Figure 1A:
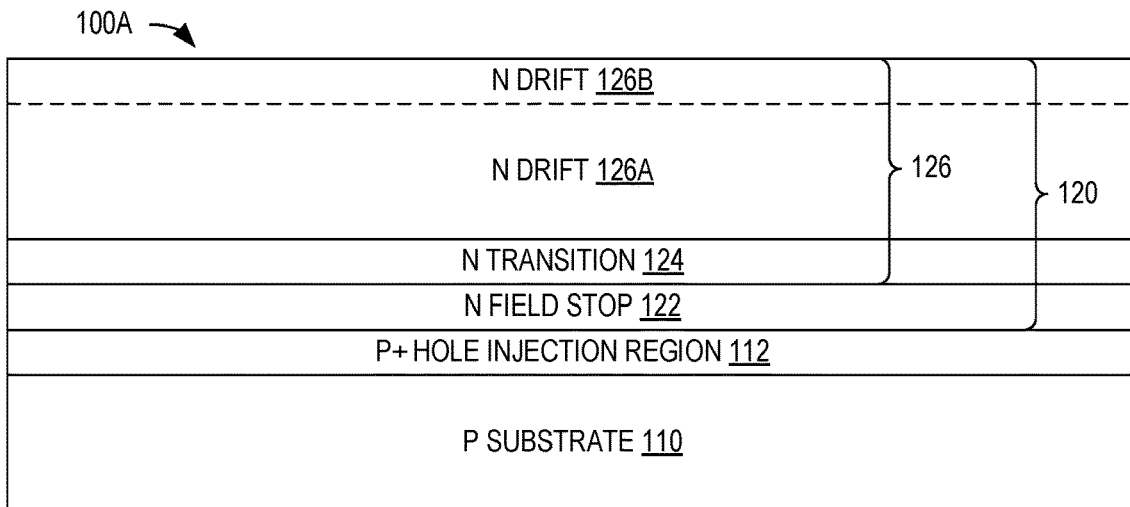
FIG. 1A shows a cross section of an example implementation of an IGBT wafer using a P substrate with a P+ hole injection layer or region.

FIG. 1A shows a cross section of one implementation of a wafer 100A in which a vertical field stop IGBT may be fabricated. Wafer 100A includes a P− or P substrate 110. P substrate 110 may be a silicon substrate containing boron or other P-type dopants at a concentration of about 1e14 $cm^{-3}$ or more, e.g., a concentration above 1e15 $cm^{-3}$ but less than 5e16 $cm^{-3}$. A P+ hole injection region 112 can be formed in or on P substrate 110 either by growing a P+ epitaxial layer to thickness between about 5 and 15 µm on substrate 110 or by ion implantation of substrate 110 with boron or other P-type impurities. After the ion implantation, the boron or other P-type impurities may be diffused and activated in the P substrate 110 at high temperatures, e.g., ranging from 1100-1200° C., for many hours to reach targeted P+ thickness, e.g., 5 to 15 µm. The resulting doping concentration of hole injection regions 112 may be between about $2e17$ cm$^{-3}$ and $5e19$ cm$^{-3}$. In the implementation of FIG. 1A, P+ hole injection region 112 is a layer covering the top surface of P substrate 110.

An epitaxial layer 120 is grown on P substrate 110 overlying P+ hole injection region 112. Epitaxial layer 120 includes multiple segments or layers with different dopant concentrations. In one implementation, epitaxial layer 120 is intrinsic or lightly-doped silicon grown on P+ hole injection region 112. The growth process may form silicon with intrinsic N-type impurities at desired concentrations, or layers for epitaxial 120 may be subject to one or more ion implantations to provide desired concentrations of impurities. In wafer 100A, a bottom layer of epitaxial layer 120 is an N field stop (FS) layer 122 about 1 to 15 microns, generally 3 to 10 microns, thick that contains N-type dopants such as phosphorous (P), arsenic (As), antimony (Sb) or combination of phosphorous and either arsenic or antimony at a concentration ranging from $5e14$ cm$^{-3}$ to $1e18$ cm$^{-3}$ or more particularly between about $5e15$ to $5e17$ cm$^{-3}$. Field stop 122 may be grown with the desired dopant concentration or may be grown as an intrinsic semiconductor or having a light doping of the second conductivity and then ion implanted with phosphor (P), arsenic (As), or Antimony (Sb) ion at a dose between about $5e11$ and $5e13$ cm$^{-2}$.

A drift region 126 is formed on field stop 122 and may have a bathtub type doping profile. In particular, drift region 126 in the implementation of FIG. 1A includes a transition layer or region 124 that is about 2 to 5 microns thick and may have a concentration of about $5e14$ cm$^{-3}$ to about $5e15$ cm$^{-3}$ of N-type dopants to compensate for N-type impurity diffusion from FS region 122 into the overlying N drift region 126. Drift region 126 further includes a thicker N-type segment 126A of epitaxial layer 120, e.g., about 40 to 120 microns thick depending on the desired voltage rating of the IGBT. Segment 126A is more lightly doped and provides a high voltage blocking segment of drift region 126 above transition region 124. N drift region segment 126A may be the thickest and most lightly doped segment of drift regions 126, e.g., having a doping concentration of about $3e13$ to $4e14$ cm$^{-3}$ depending on the blocking voltage of the IGBT. A surface segment 126B of drift region 126 is employed in some implementations and may have a doping concentration between about $1e14$ and $1e15$ cm$^{-3}$, which is a heavier doping concentration than the high voltage blocking segment 126A of drift region 126.

Figure 1B:
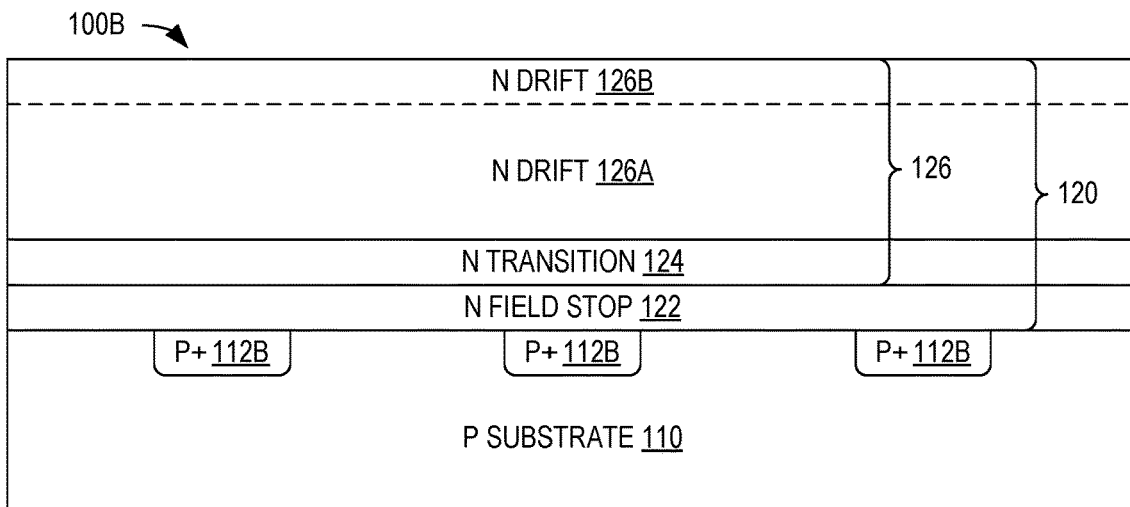
FIG. 1B shows a cross section of an example implementation of an IGBT wafer using a P substrate with a patterned P+ hole injection region including multiple islands.

FIG. 1B shows a cross section of an alternative implementation of a wafer 100B for fabrication of a vertical field stop IGBT. Wafer 100B differs from wafer 100A of FIG. 1A in that P-type substrate 110 includes a patterned P+ hole injection region 112B made up of multiple islands that may be disconnected from each other. Alternatively, P+ hole injection region 112B may be a heavily doped region surrounds islands of silicon having the lighter doping of substrate 110. P+ hole injection region 112B may be formed in P substrate 110 using a patterned ion implantation process, e.g., ion implantation through a mask covering a top surface of substrate except where areas of P+ hole injection region 112B are desired. A thermal process as described above may be used to diffuse implanted impurities to the desired depth, e.g., between about 5 and 15 µm. Wafer 100B otherwise includes an N− type epitaxial layer 120 including N field stop layer 122 and N drift layer 126 as described above with reference to FIG. 1A. Patterned P+ hole injection region 112B in wafer 100B does not cover the top surface of P substrate 110, and the ratio of the area of P+ hole injection region 112B to the back side surface area may be selected to control the level of hole injection for switching and Vce performance optimization of the IGBT. For example, patterned P+ injection region 112B may cover about 10% to 90% of the surface of substrate 110.

Figure 1C:
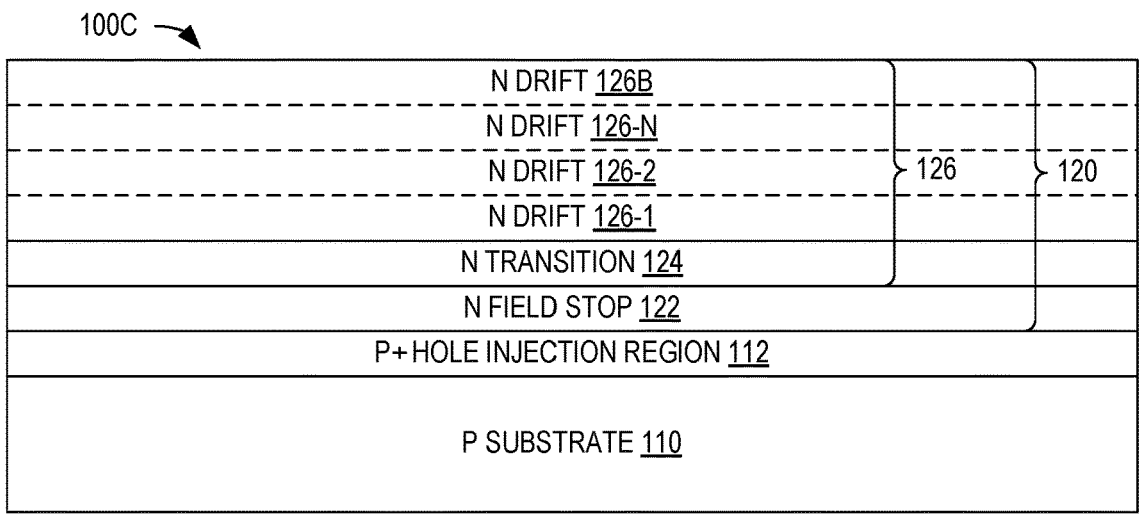
FIG. 1C shows a cross section of an example implementation of an IGBT wafer containing a multi-segmented drift layer with a P substrate containing a P+ hole injection layer or region.

FIG. 1C shows a cross section of another alternative implementation of a wafer 100C for fabrication of a vertical field stop IGBT. Wafer 100C may be the same as wafer 100A, except that N drift region 126 in wafer 100C is a multi-segment drift region including a deepest high voltage blocking segment 126-1 having a highest doping concentration, successively shallower voltage blocking segments 126-2 to 126-N having successively lower doping concentrations. In one implementation, segments 126-1 to 126-N have dopant concentrations between about $5e15$ and $5e14$ cm$^{-3}$ and have thickness between about 2 and 10 microns each. Surface segment 126B of drift region 126, is some cases, may have a heavier doping concentration than the high voltage blocking segments 126-1 to 126-N of drift region 126.

Figure 1D:
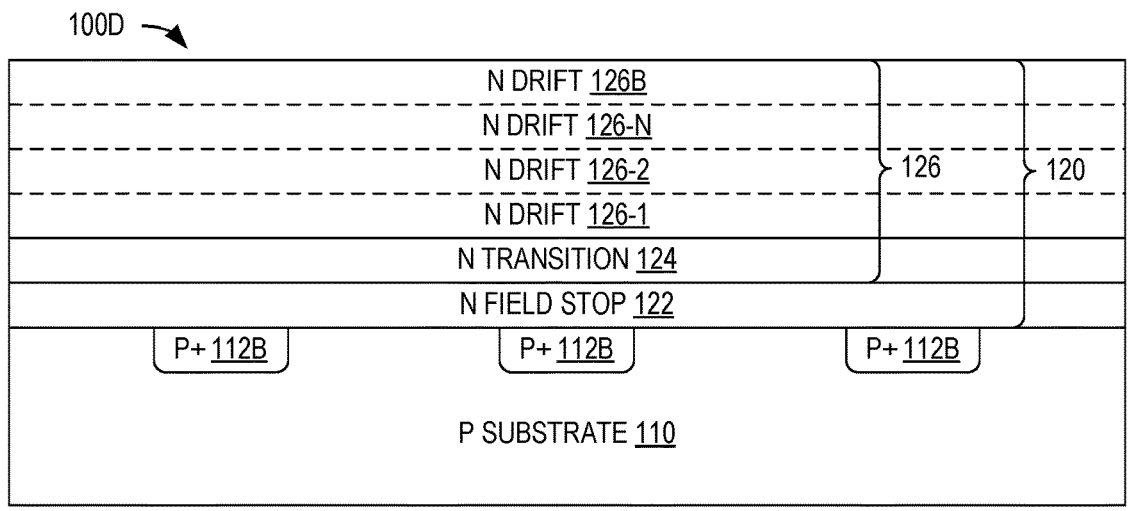
FIG. 1D shows a cross section of an example implementation of an IGBT wafer containing a multi-segmented drift layer with a P substrate containing a patterned P+ hole injection region including multiple islands.

FIG. 1D is a cross section of still another implementation of a wafer 100D for fabrication of an vertical field stop IGBT. Wafer 100D employs a P substrate 110 containing a patterned P+ hole injection region 112B including or surrounding multiple islands as described with reference to wafer 100B of FIG. 1B. Wafer 100D also includes an epitaxial layer 120 with a drift region 126 including multiple high voltage blocking segments 126-1 to 126-N as described with reference to wafer 100C of FIG. 1C.

Figure 1E:
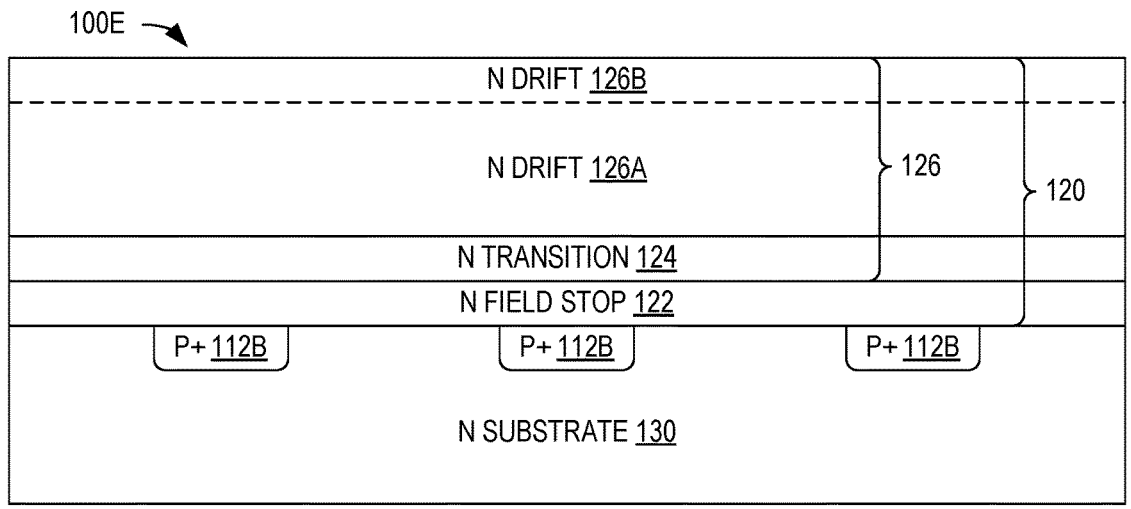
FIG. 1E shows a cross section of an example implementation of an IGBT wafer for fabrication of an RC IGBT using an N substrate containing a P+ hole injection layer or region.

FIG. 1E is a cross section of still another implementation of a wafer 100E that is identical to wafer 100C of FIG. 1C, except that patterned P+ hole injection region 112B is formed in an N-type substrate 130. N substrate 130 may be a silicon substrate with a concentration of about $1e15$ cm$^{-3}$ of N-type dopants. As described further below, wafer 100E may be used for fabrication of an vertical field stop RC IGBT.

Figure 1F:
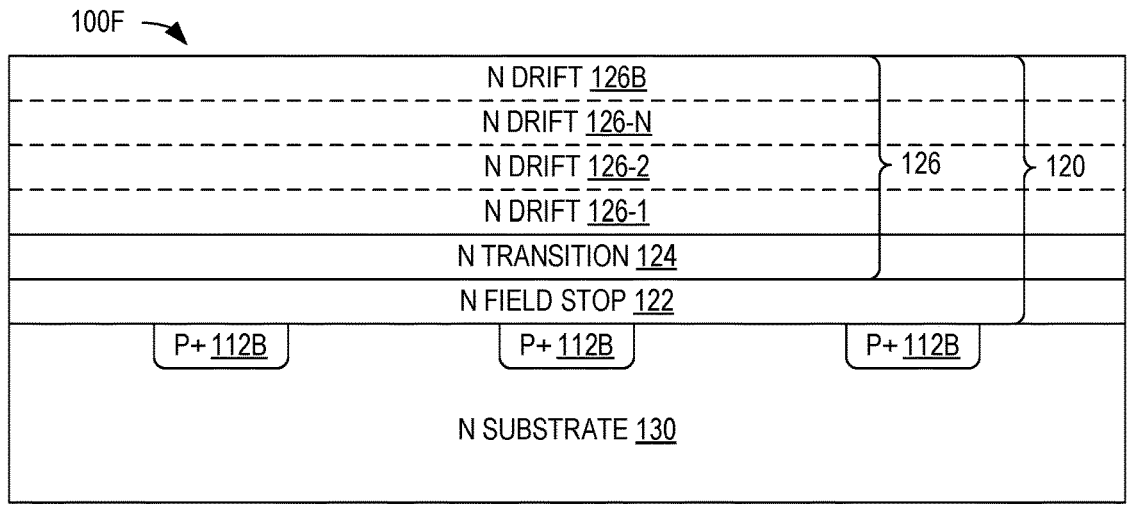
FIG. 1F shows a cross section of an example implementation of an IGBT wafer for fabrication of an RC IGBT containing a multi-segmented drift layer with an N substrate containing a patterned P+ hole injection region including multiple islands.

FIG. 1F is a cross section of still another implementation of a wafer 100F that is identical to wafer 100D of FIG. 1D, except that patterned P+ hole injection region 112B is formed in an N-type substrate 130. Like wafer 100E of FIG. 1E, wafer 100F may be used for fabrication of an vertical field stop RC IGBT as described further below.

Figure 1G:
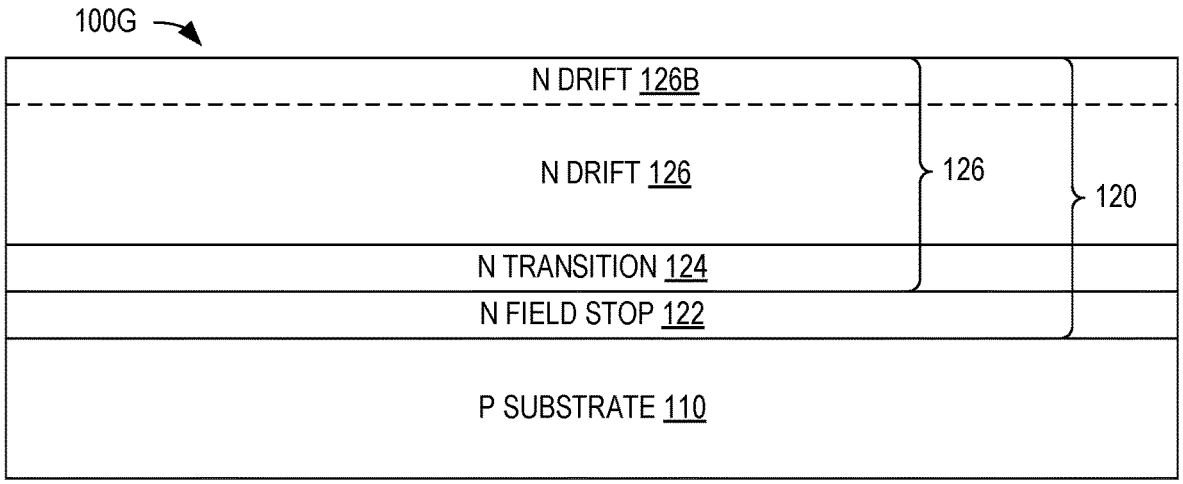
FIG. 1G shows a cross section of an example implementation of an IGBT wafer including a P substrate without hole injection regions.

FIG. 1G shows a cross section of yet another implementation of a wafer 100G for fabrication of a vertical field stop IGBT. Wafer 100G may be identical to wafer 100A or 100B, except that wafer 100G does not include a P+ hole injection region. As described further below, instead of employing a P+ hole injection region formed in or on a substrate 110 or 130 before deposition of epitaxial layer 120, one or more P+ hole injection may be fabricated on a bottom surface of a device, e.g., using P+ sputtered silicon as described further below.

Figure 1H:
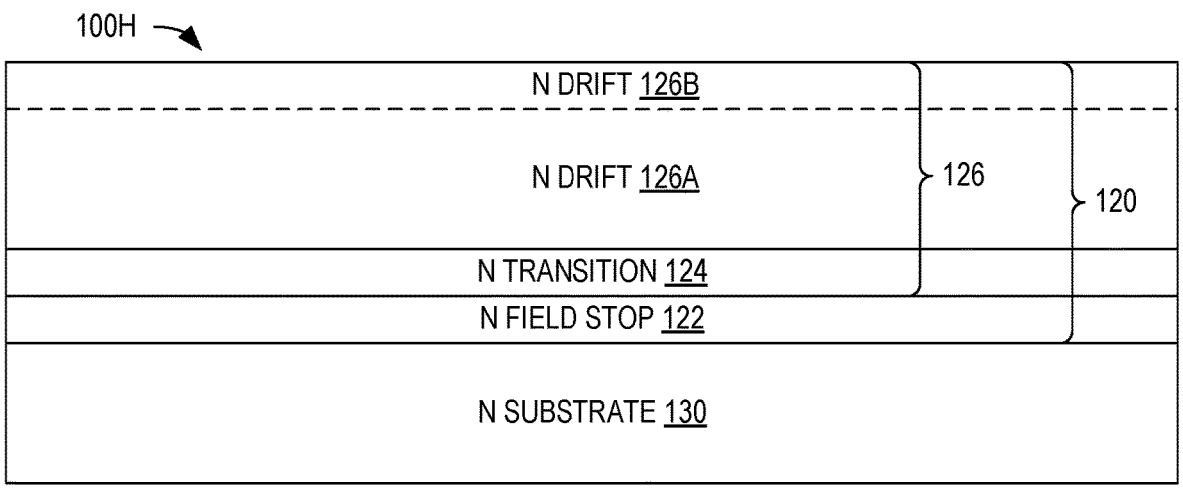
FIG. 1H shows a cross section of an example implementation of an IGBT wafer including an N substrate without hole injection regions.

An vertical field stop IGBT using sputtered back-side material may also be fabricated using a wafer 100H that includes an N-type substrate 130. FIG. 1H in particular shows an implementation of wafer 100H including an N substrate 130 on which an epitaxial layer 120 including N field stop 122 and drift region 126, e.g., N layers 124, 126A and 126B, are grown on N substrate 130 that does not have a P+ hole injection region. Wafer 100H may be preferable for the fabrication of RC IGBTs.

Figure 2A:
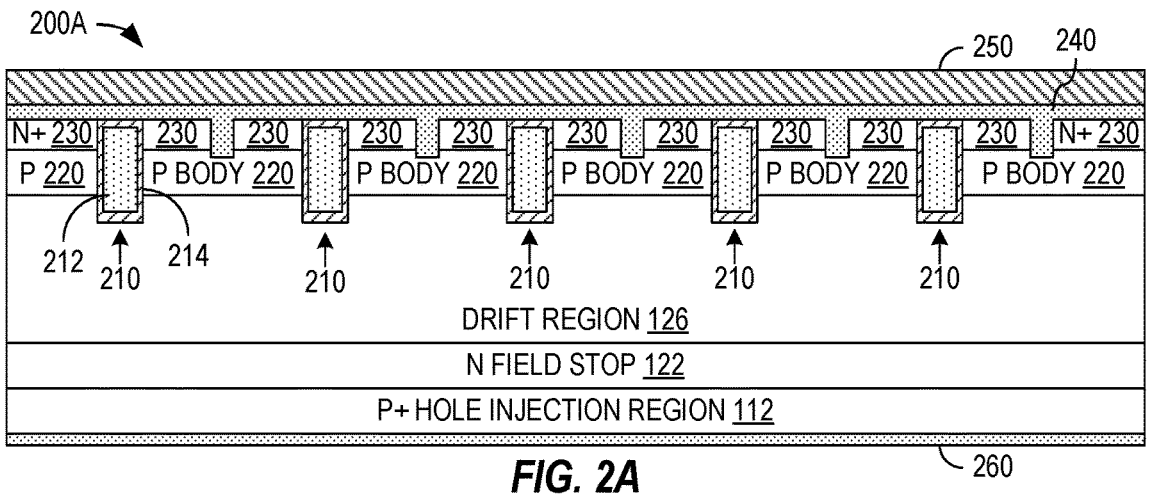
FIG. 2A shows a cross-section of an example implementation of a trench field stop IGBT employing a P+ hole injection layer that remains after back side grinding.

FIG. 2A shows a cross section of a trench field stop IGBT 200A that may be fabricated in wafer 100A of FIG. 1A or wafer 100C of FIG. 1C. In IGBT 200A, hole injection region 112 forms a P-type collector of a vertical PNP bipolar transistor. N field stop 122 and drift region 126 form an N-type base of the vertical PNP bipolar transistor, and a P– type body region 220 forms a P-type emitter of the vertical PNP bipolar transistor. IGBT 200A also includes a vertical field effect transistor having gate structures 210, each including a conductive gate 212 with surrounding insulation such as gate oxide 214. P body 220, which may have been implanted in N drift region 126, forms both the emitter of the PNP bipolar transistor and the channel regions of the field effect transistor. N-type source regions 230 for the field effect transistor may be implanted in a top portion of drift region 126 above portions of P body 220. More specifically, P body regions 220 adjacent to trench gate structures 210 in gate trench areas of epitaxial layer 126 provide a vertical P channel of the field effect transistor, with the P channel being between N-type source regions 230 and deeper N-type portions of drift region 126, and a voltage applied to conductive gates 212 in gate structures 210 can control the current that the field effect transistor injects into the base of the vertical PNP bipolar transistor. A metal emitter contact and interconnect structure 240 is formed on a front side of IGBT 200A and electrically contacts P body region 220, i.e., the P-type emitter of the vertical PNP bipolar transistor. Contact and interconnect structure 240 may include an interconnect formed of a metal such as titanium (Ti), titanium nitride (TiN), and Tungsten (W) extending through vias to active front-side IGBT structures and a contact layer of a metal such as (Al:Si) or Al:Cu:Si.

A metal gate contact (not shown) may be similarly on the front side of IGBT 200A and electrically connected to conductive gates 212 in gate structures 210. A passivation layer 250 may cover and protect underlying front-side structure and provide openings (not shown) to contact pads areas for external electrical connections to metal emitter contact structure 240 and to gate contacts (not shown).

IGBT 200A further includes a metal collector contact 260, which contacts a P+ hole injection region 112, and may be formed on the back side of trench field stop IGBT 200A after substrate 110 (FIG. 1A) is ground sufficiently to provide a reliable contact between P+ hole injection region 112 and metal collector contact 260. P+ hole injection region 112 may be relatively thick, e.g., up to 15 µm, and back side grinding may be targeted to thin substrate 100 to nominally remove a deepest portion, e.g., the bottom 3 µm of P+ hole injection region 112. For example, after back-side grinding, a thickness between about 2 and 12 microns of injection region 112 may remain from a thickness between 5 to 15 microns of P+ hole injection region 112 before back-side grinding. The target thickness for backside grinding generally depends on the accuracy of the processes fabricating P+ hole injection region 112 and the accuracy of the processes grinding the back side of substrate 110. Metal contact 260 may be formed on the ground surface, for example, by sputtering or vacuum evaporation of a metal such as Al:Ti: Ni:Ag or Au onto the back surface of the IGBT and then sintering at temperature below 400° C. after back metal deposition to improve ohmic contact to the back side exposed surface of P+ hole injection region 112.

Figure 2B:
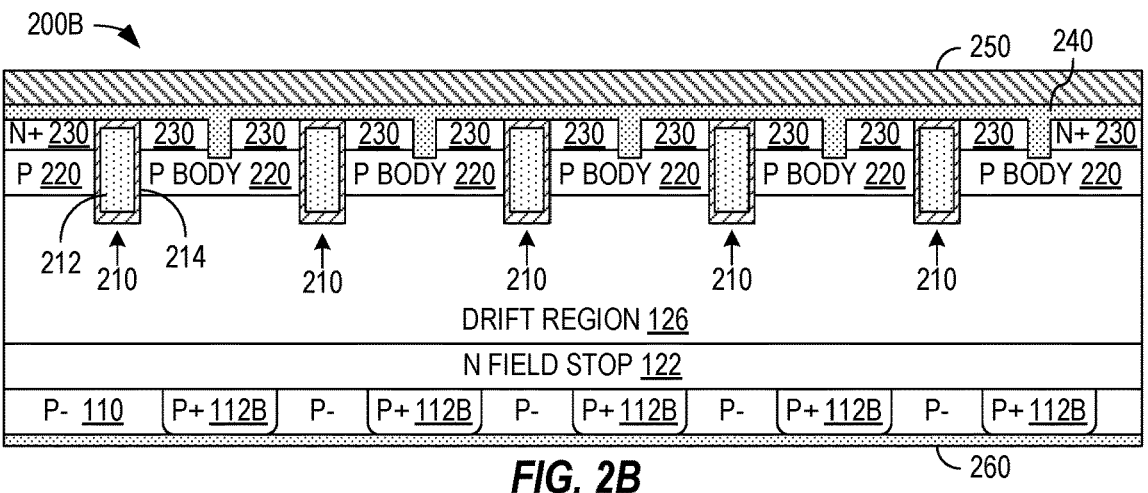
FIG. 2B shows a cross-section of an example implementation of a trench field stop IGBT employing a patterned P+ hole injection region in P− material that remains after back side grinding.

FIG. 2B shows a cross section of a completed trench field stop IGBT 200B that may be fabricated using wafer 100B of FIG. 1B or wafer 100D of FIG. 1D. IGBT 200B may include the same front-side structure as in IGBT 200A of FIG. 2A. In particular, the top-side structure of IGBT 200B includes trench gate structures 210, P body region 220, and source region 230 that may be fabricated in drift region 126 and metal contact structure 240 and passivation 250 formed contacting or overlying other top-side structures. For fabrication of collector contact 260 of IGBT 200B, after the fabrication of the top-side structure, a back side wafer grinding of wafer 100B exposes the bottom portion of patterned P+ hole injection region 112B and leaves intervening P– regions of P substrate 110 around patterned P+ hole injection region 112B. Back side metallization forms collector contact 260 in contact with patterned P+ hole injection region 112B and the complementary P– regions remaining from substrate 110.

Figure 2C:
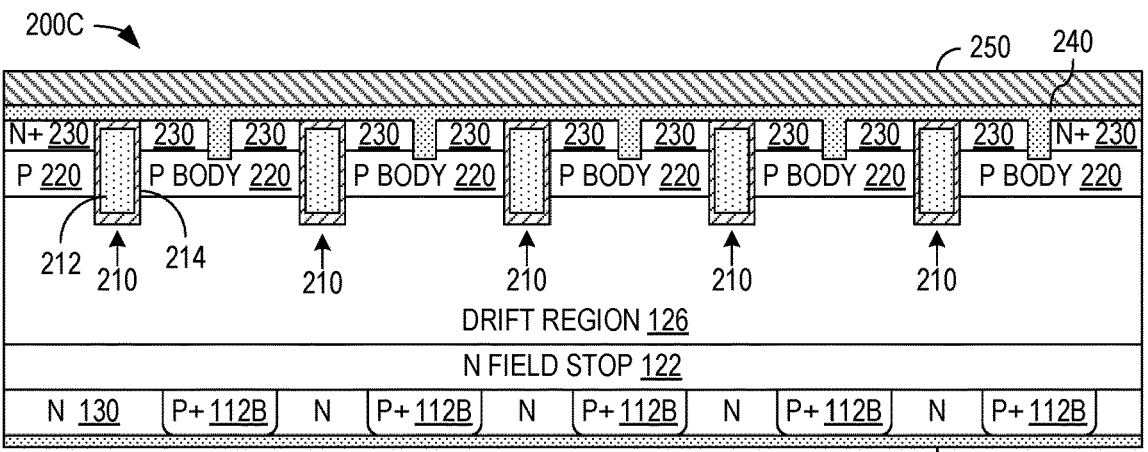
FIG. 2C shows a cross-section of an example implementation of a field stop RC IGBT employing multiple P+ regions in N-type material that remains after back side grinding.

FIG. 2C shows a cross section of a completed trench field stop RC IGBT 200C that may be fabricated using wafer 100E of FIG. 1E or wafer 100F of FIG. 1F. RC IGBT 200C may include the same front-side structure as in IGBT 200A or 200B of FIG. 2A or 2B. In particular, the top-side structure of IGBT 200C includes trench gate structures 210, P body region 220, and source region 230 that may be fabricated in drift region 126 and metal contact structure 240 and passivation 250 formed contacting or overlying other top-side structures. For fabrication of collector contact 260 of IGBT 200C, after the fabrication of the top-side structure, a back side wafer grinding of N substrate 130 of wafer 100D or 100E exposes patterned P+ hole injection region 112B and a complementarily patterned N region of N substrate 130. Back side metallization forms collector contact 260 in contact with patterned P+ hole injection region 112B and the complementarily patterned N region. A reverse conduction diode is thus formed in RC IGBT 200C from collector electrode 260 through N-type material including the remaining N-type portion of N substrate 130, field stop region 122, and drift region 126 to P-type material of P body 220, which is electrically connected to the emitter electrode 240.

Figure 3A:
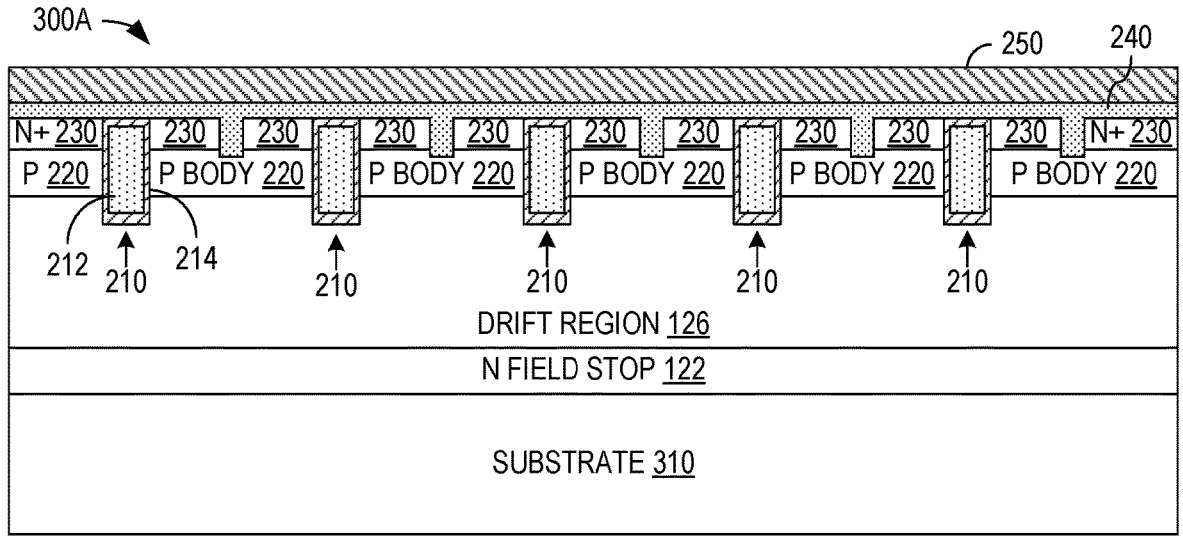
FIG. 3A shows a cross-section of an example implementation of a wafer including a trench IGBT fabricated on a front side of the wafer before back side processing.

FIG. 3A shows a cross section of wafer 300A after completion of top-side structure of a field stop IGBT but before back-side processing. Wafer 300A may be fabricated from either wafer 100G of FIG. 1G or wafer 100H of FIG. 1H. Wafer 300A particularly includes a substrate 310, which may be a P substrate 110 as in wafer 100G of FIG. 1G or an N substrate 130 as in wafer 100H of FIG. 1H. An N field stop 122 and a drift region 126 overlie substrate 310. The front-side structure in wafer 300A includes trench gate structures 210, P body region 220, and source region 230 that may be fabricated in drift region 126 and metal contact layers 240 and passivation 250 formed contacting or overlying other front-side structures. Wafer 300A thus shows a wafer structure ready for back side processing.

Figure 3B:
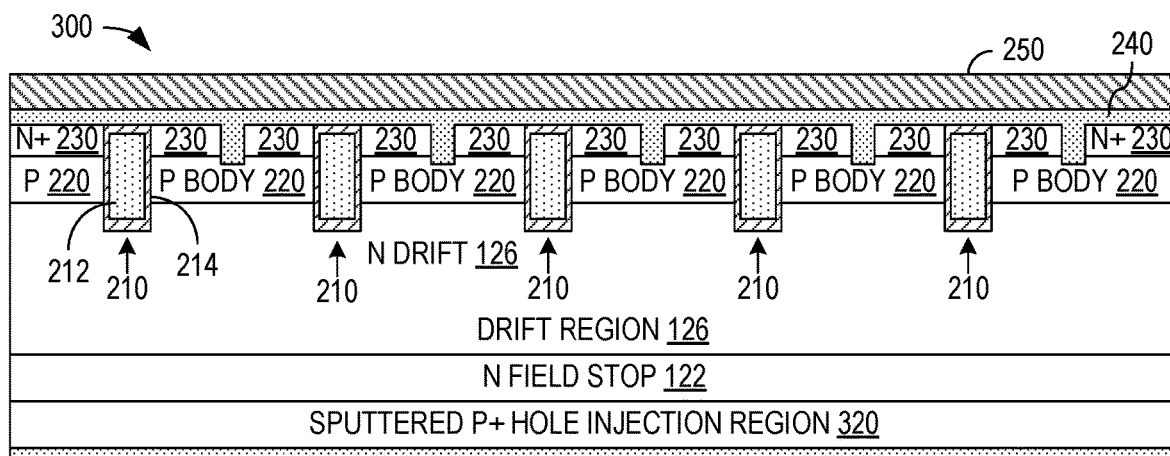
FIG. 3B shows a cross-section of the wafer of FIG. 3A after back side grinding, P+ silicon sputtering, and back metal deposition.

Back side processing of wafer 300A may include back side grinding to remove substrate 310 and expose N field stop 122. The grinding process may be targeted to leave a thin portion (not shown) of substrate 310, so that variations or tolerated inaccuracy in the grinding process cannot significantly alter the thickness of N field stop 122. A thin portion of lightly doped substrate 310, which may or may not be left after grinding, typically has little or no effect on performance of the IGBT. After back-side grinding, sputtering using a silicon target with known and well controlled doping concentration forms a sputtered P+ hole injection region 320. P+ hole injection may have a doping concentration from about 1e17 to 5e19 cm$^{-3}$ and a thickness from about 0.25 um to 2 microns. Back-side metal deposition forms a metal collector contact 260 on sputtered P+ hole injection region 320 as in a field stop IGBT 300 of FIG. 3B.

Field stop IGBT 300 has a sputtered P+ hole injection region 320 that may cover the entirety, i.e., 100% of, the back side of IGBT 300. In other implementations of a field stop IGBT, the P+ hole injection region may be patterned to cover a smaller percentage of the back side with the percentage being selected according to the desired switching characteristics of the IGBT. Additionally, N-type silicon regions may be desired in gaps left by a patterned P+ hole injection region, and such N-type silicon contacting the collector electrode to provide a diode path for an RC IGBT.

Figure 4A:
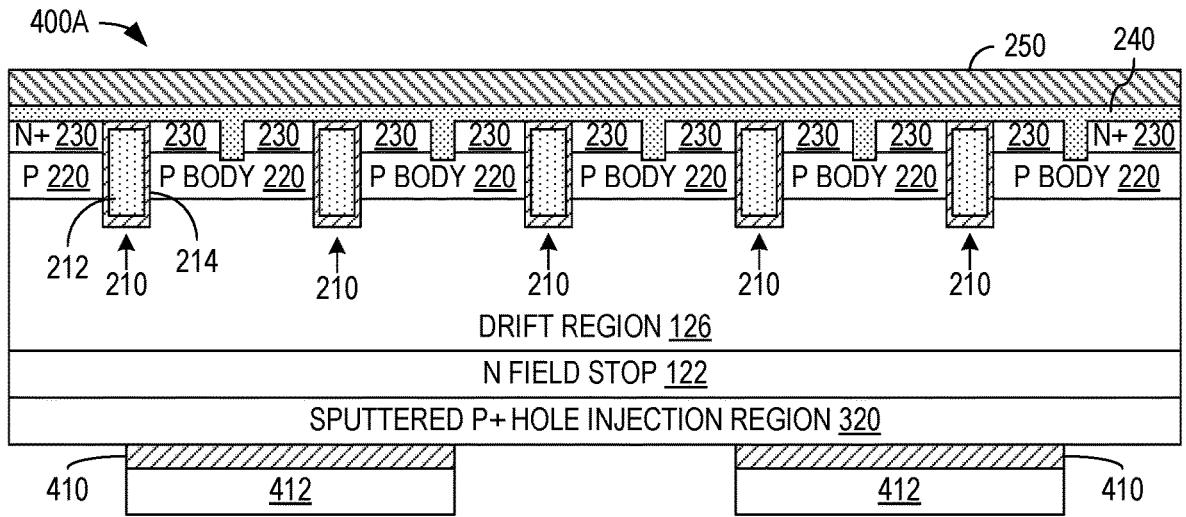
FIG. 4A shows a cross-section of the wafer of FIG. 3A after application of P+ sputtered silicon and a back side mask.
Figure 4B:
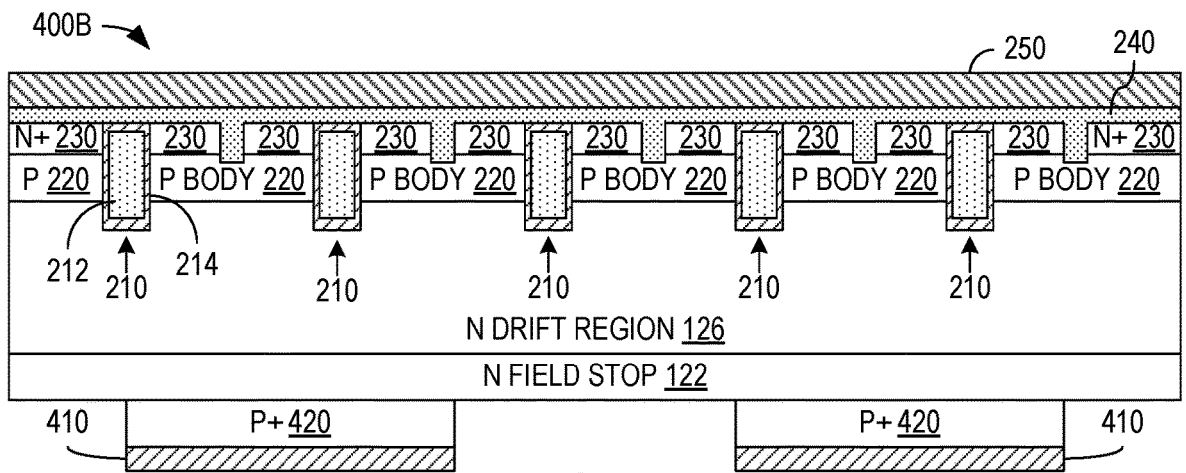
FIG. 4B shows a cross-section of the wafer of FIG. 4A after etching the sputtered P+ using the back side oxide mask.
Figure 4C:
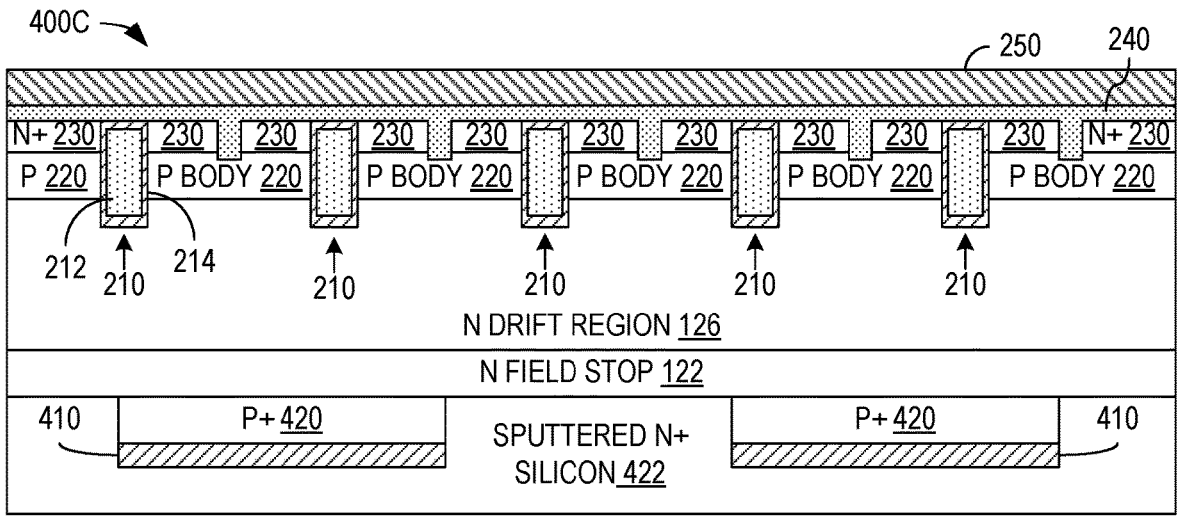
FIG. 4C shows a cross-section of the wafer of FIG. 4B after sputtering of N+ sputtered silicon on the back side of the wafer.
Figure 4D:
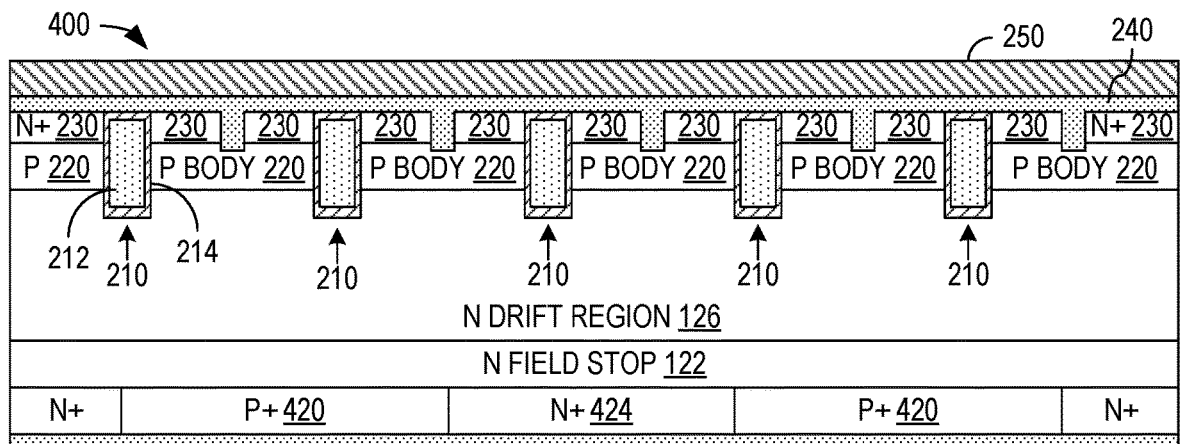
FIG. 4D shows a cross-section of the wafer of FIG. 4C after etching back N+ sputtered silicon, removing the oxide mask, and depositing back-side metal.

FIGS. 4A, 4B, 4C, and 4D show back side processing steps for forming of a reverse conducting trench field stop IGBT 400 from wafer 300A of FIG. 3A. IGBT 400 as shown in FIG. 4D includes both sputtered P+ hole injection silicon regions 420 and sputtered N+ electron injection silicon regions 424. FIG. 4A shows a cross section of a wafer 400A after back side grinding removes substrate 310 from wafer 300A and sputtering forms sputtered P+ silicon layer 320 on N filed stop 122. As noted above, a thin layer (not shown) of the lightly N or P dope silicon from substrate 310 may remain between sputtered P+ layer 320 and N field stop 122. An oxide layer 410 is formed on sputtered P+ silicon layer 320, and masking and etching processes, e.g., using a photoresist mask 412, patterns oxide layer 410 as shown in FIG. 4A. Patterned oxide layer 410 exposes portions of P+ sputtered layer 320, so that an etch process using patterned oxide layer 410 as a mask removes exposed portions of P+ sputtered layer 320 and leave a patterned P+ hole injection regions 420 as shown in wafer 400B of FIG. 4B. Oxide 410 and P+ sputtered regions 420 protect N field stop 122 so that the thickness of N field stop 122 adjacent to P+ regions 420 remains unchanged. The etching exposes other areas of N field stop 122, and some over etching, e.g., into the exposed areas of field stop 122, is tolerable. As shown in FIG. 4C, a sputtering process can then deposit a N+ silicon layer 422 in ohmic contact with N buffer or field stop region 122 in a wafer 400C. Back side grinding removes oxide mask layer 410 (and portions of sputtered N+ silicon layer 422) to expose P+ hole injection regions 420 and leave N+ electron injection regions 424 as shown in FIG. 4D. N+ electron injection regions 424 may have a N-type doping concentration between about 1e19 and 1e20 cm$^{-3}$ and thickness between about 0.25 and 2 microns. A collector electrode 430 may be formed of a metal such as Al:Ti:Ni:Ag or Au in ohmic contact with regions 420 and 434. The electrical path from collector electrode 430 though N-type silicon in N+ electron injection regions 424, field stop 122, and drift region 126 to P body regions 220 and emitter electrode 240 forms a reverse conducting vertical diode integrated with trench field stop IGBT 400 as shown in FIG. 4D.

A patterned back side sputtering process may alternatively form a mask on a back side of a ground wafer and sputter one conductivity type of silicon onto back side areas exposed by a mask. The mask can then be removed, and silicon having the opposite conductivity type may be sputtered on areas of the wafer back side corresponding to the removed mask. Back side metal can be formed after an etch back or grinding process exposes the first sputtered silicon.

Figure 5A:
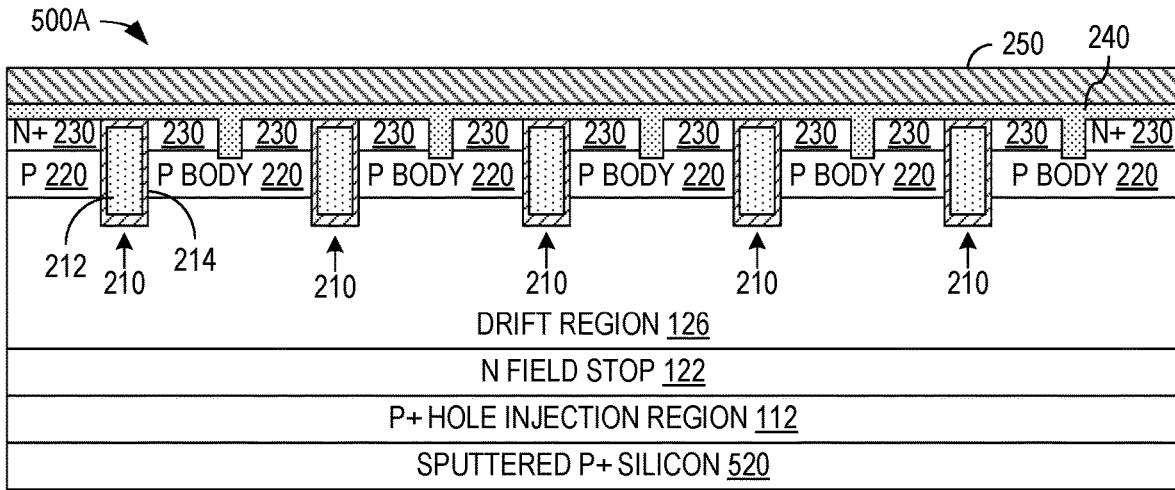
FIG. 5A shows a cross-section of a trench field stop IGBT structure with a P+ hole injection region remaining from a substrate and back-side P+ silicon sputtered on the P+ hole injection region.
Figure 5B:
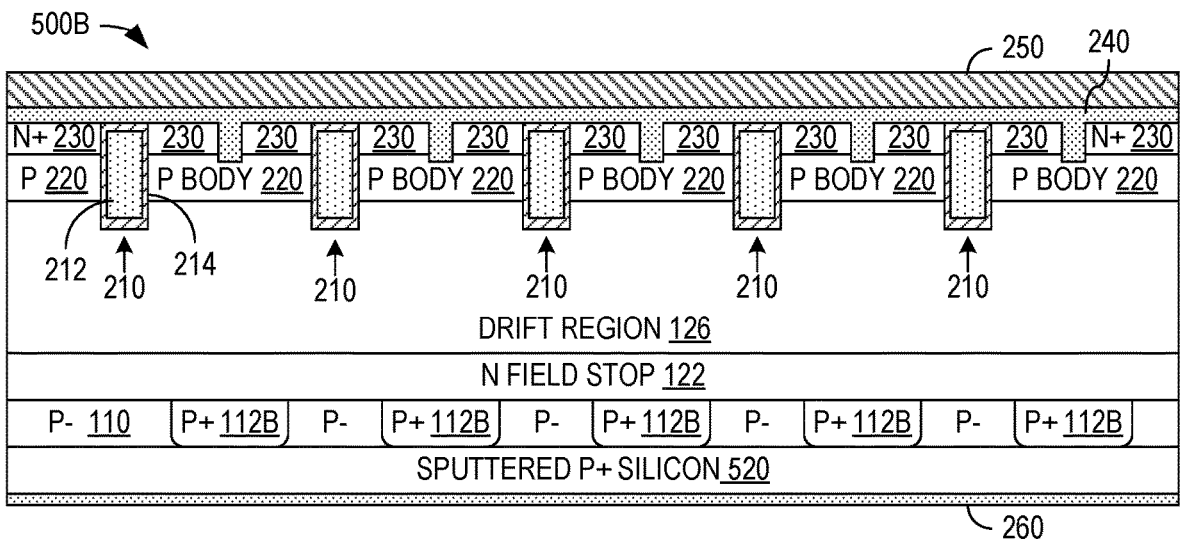
FIG. 5B shows a cross-section of a trench field stop IGBT with a patterned P+ hole injection region in P− silicon from a substrate and sputtered back-side P+ silicon.

FIG. 5A and FIG. 5B respectively show cross sections of trench field stop IGBTs 500A and 500B, which include both P+ hole injection regions formed before overlying front-side structures and sputtered P+ silicon 520 deposited on the back side of IGBTs 500A and 500B after back-side grinding. IGBT 500A may be fabricated using wafer 100A of FIG. 1A or wafer 100C of FIG. 1C and includes front-side IGBT structures such as described above with reference to FIG. 2A. IGBT 500B may be fabricated using wafer 100B of FIG. 1B or wafer 100D of FIG. 1D and may include the same front-side IGBT structures as IGBT 500A. IGBT 500A and 500B differ in that IGBT 500A has a continuous P+ hole injection region 112 as a layer underlying the tope side structure, IGBT 500B instead has a patterned P+ hole injection region 112B and a complimentarily patterned P− region remaining from the ground substrate. IGBT 500A or 500B can be fabricated by grinding P substrate 110 to expose P+ region 112 or 112B and then sputtering P+ silicon in contact with P+ region 112 or 112B. This process, which combines use of a P substrate with an implanted and diffused P+ region 112 or 112B with sputtered P+ silicon hole injector 520, allows use a lower ion implant dose for diffused P+ hole injector regions 112 or 112B by making ohmic contact to sputtered P+ silicon 520 and through sputtered P+ silicon 520 to P+ hole injector region 112 or 112B.

Figure 6A:
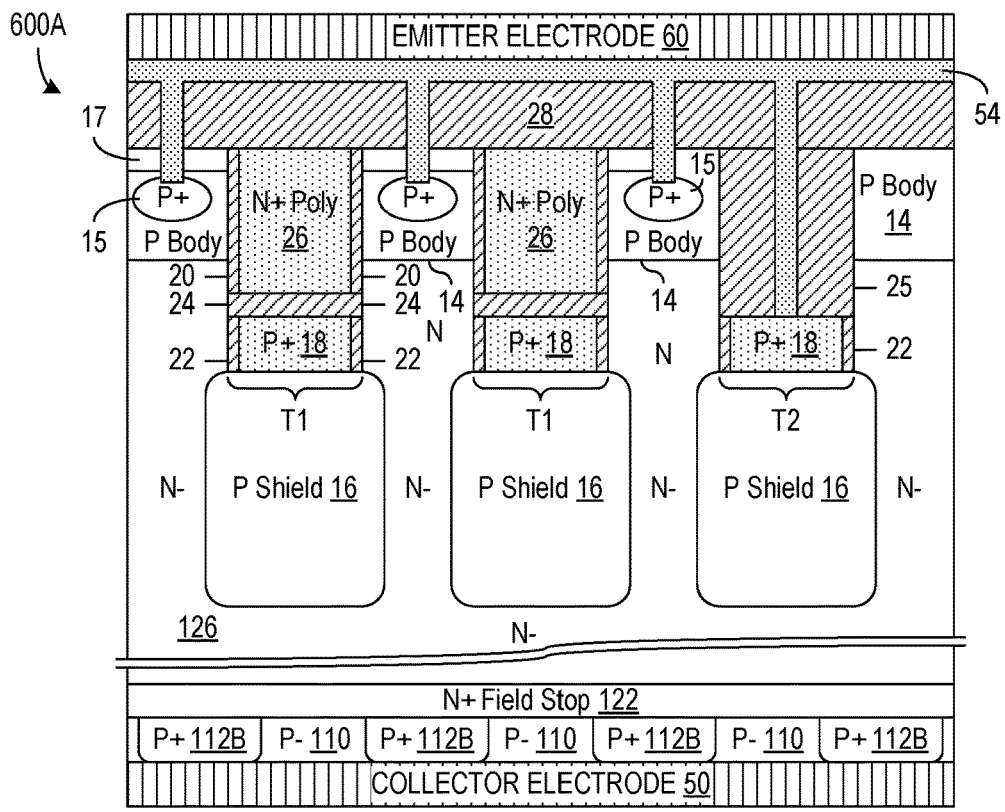
FIG. 6A shows a cross-section of a P poly shielded, trench field stop IGBT structure with the remainder of a P substrate including P+ regions as hole injectors.

The back side processing and structures described above may be employed with a variety of different front-side IGBT structures. FIG. 6A, for example, shows a cross-section including parts of an active cell region and a termination region of a shielded field stop IGBT 600A. IGBT 600A includes an N+ field stop layer 122 and an N-type drift region 126 in which front-side structures are formed. In the example of FIG. 6A, drift region 126 may be an epitaxial layer with a doping concentration that increases from a low concentration N−-adjacent to N+ field stop 122 to a higher N doping at a top surface of epitaxial layer 126. P+ hole injector regions 112B, N-type layers 122 and 126, and a P-type body region 14 form active regions of the vertical PNP bipolar transistor of IGBT 600A. IGBT 600A also includes a field effect transistor including an N-type source region 17, conductive gates 26, gate oxide 20, and channels in P body region 14. Structures forming the field effect transistor include P body region 14, which are adjacent to trench gate 26 in gate areas T1 of epitaxial layer 126 and provide a vertical P channel of the field effect transistor. The P channel of the field effect transistor is between N-type source region 17 and N-type drift region 126, and the voltage on conductive gates 26 can control the current through the field effect transistor to the base of the vertical PNP bipolar transistor.

IGBT 600A further includes shield structures. In particular, the shield structure includes P+ polysilicon regions 18 that are laterally bounded by oxide spacers 22 and separated from overlying conductive gates 26 by an inter-poly oxide layer 24. The shield structure further includes P shield regions 16 formed in drift region 126 of IGBT 600A. P shield regions 16 and the surrounding drift region 126 have majority charge carriers of opposite conductivity types but may have substantially the same charge carrier density. Each polysilicon shield region 18 (with its underlying shield region 16) may be shorted to source regions 17 or may be floating or may have a separate contact for independent control of the voltage applied to the polysilicon shield regions 16. For IGBT 600A, P poly shield regions 18 and underlying shield regions 16 in an active device area, e.g., trench areas T1, may be fully floating to minimize potential drop (Vce) across the emitter and collector electrodes 60 and 50. Some of P poly shield regions 16 and underlying shield regions 18 in IGBT 600A, e.g., in trench areas T2, may be ohmically shorted to emitter electrode 60 through a conductive interconnect 54 extending through a surrounding insulating structure 25. Shorting at least some shield regions 16 and 18 to the emitter may improve switching performance and/or optimized Vce.

U.S. patent application Ser. No. 16/363,812, entitled "Shielded Trench Devices," further discloses some front-side structures and processes for shielded trench IGBTs and is hereby incorporated by reference in its entirety.

Figure 6B:
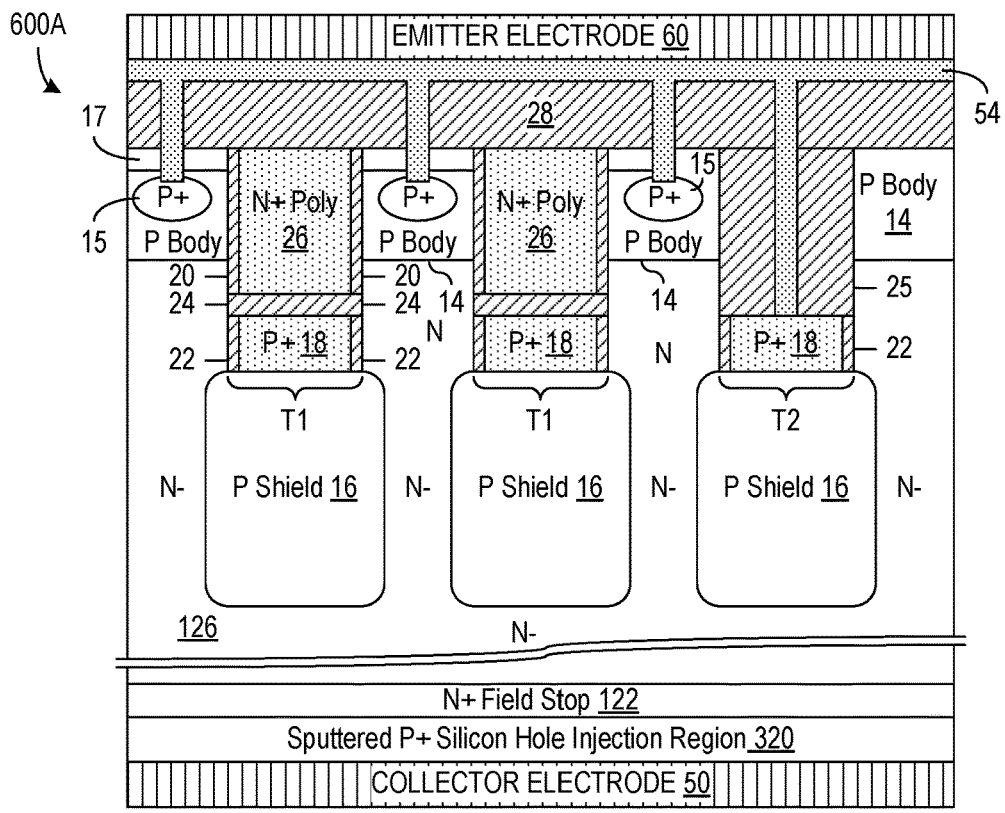
FIG. 6B shows a cross-section of a P poly shielded, trench field stop IGBT structure with sputtered P+ silicon as hole injector.
Figure 6C:
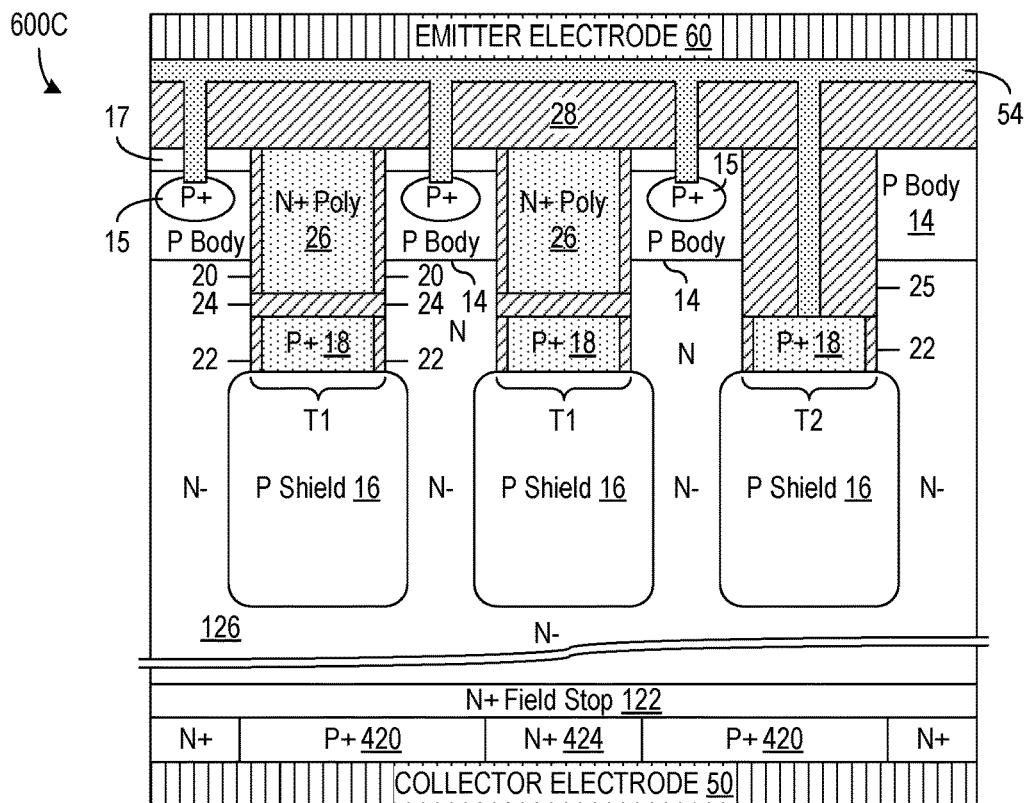
FIG. 6C shows a cross-section of a P poly shielded, trench field stop RC IGBT structure with sputtered P+ and N+ back-side silicon.

The front-side structures in shielded IGBT 600A of FIG. 6A employ a patterned P+ hole injection regions 112B such as described above with reference to FIG. 2B. The same front side IGBT structures of IGBT 600A may alternatively be employed with other back side structures described above. FIG. 6B, for example, shows a cross section of an alternative P Poly Shield Trench field stop IGBT devices 600B having a sputtered P+ hole injection region 320 as describe above with reference to FIG. 3B. FIG. 6C show a cross section of a P Poly Shield Trench field stop IGBT 600C with a patterned sputtered P+ hole injection silicon region 420 and a complementarily patterned N+ electron injection silicon region 424, as described above with reference to FIG. 4D, to provide a reverse conducting vertical diode integrated with shielded trench field stop IGBT 600C.

Figure 6D:
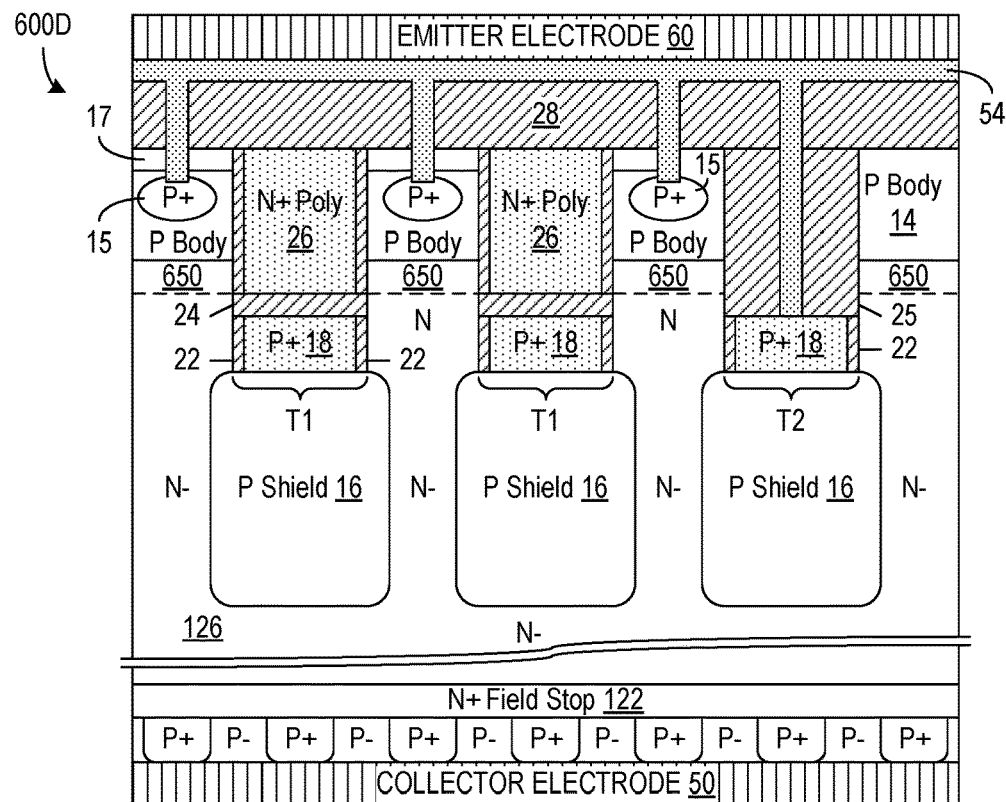
FIG. 6D shows a cross-section of a P poly shielded, trench field stop IGBT structure with P/P+ substrate including a high energy phosphorous JFET implant.

Another implementation of a shielded trench field stop IGBT 600D shown in FIG. 6D employs a front side process that includes a selective high energy phosphorous ion implantation (N-type JFET implant) to raise doping concentration in a region 650 just below P body 14 of the trench MOSFET to minimize spreading resistance between the P polysilicon filled trenches of the field stop IGBT structure. N-type JFET implant 650 may minimize Vce voltage variations due to variations of IGBT wafer surface doping concentration, trench depth and P body junction depth. The high energy phosphorous ion implantation dose may range from 5e11 to 3e12 $cm^{-2}$ with an implant energy from 1 MeV to 3 MeV.

Even though the illustrated implementations disclosed above include trench type IGBT front-side structures, all the back-side structures disclosed herein for the wafer back side processing are applicable to any kind of IGBT front-side structures including planar, trench and combination IGBTs, and these back-side processes do not require back side impurity activation that might damage the front side structures.

Figure 7A:
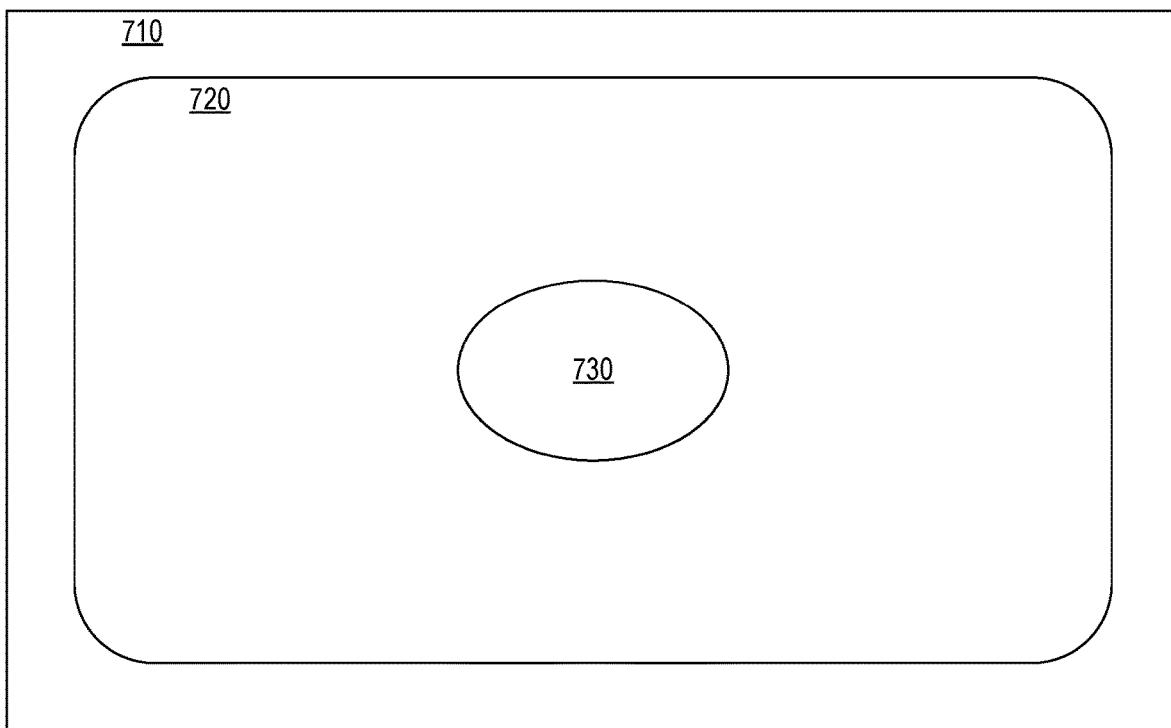
FIG. 7A shows a back side view of field stop RC IGBT structure with sputtered P+ silicon and N+ silicon patterned to for a frame covering device edges and a circular area at the center of the IGBT active area.
Figure 7B:
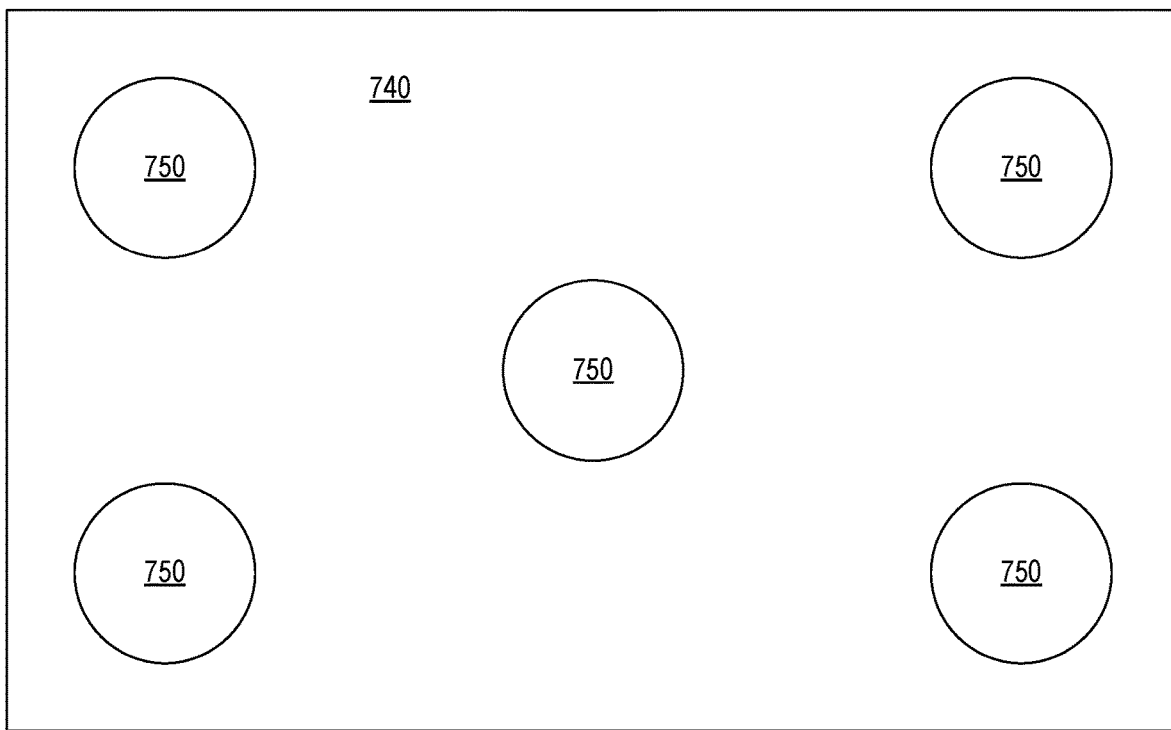
FIG. 7B shows a back side view of a trench field stop RC IGBT structure with sputtered P+ silicon patterned to surround scattered sputtered N+ silicon islands.

FIG. 7A and FIG. 7B depict plan views of patterned anode regions on the back sides of RC IGBTs such as described above with reference to FIGS. 4A to 4D. FIG. 7A shows a pattern in which the anode of a reverse conduction diode includes an N+ regions 710 and 730, which may be sputtered N-type silicon. N+ region 710 forms a ring around a P+ hole injection region 720, which surrounds N+ region 730. In contrast, the anode pattern of FIG. 7B includes multiple separated N+ electron injection regions 750 are distributed within a field formed by a P+ hole injection region 740. FIGS. 7A and 7B just show examples for patterned P+ hole injection regions with complimentarily patterned N+ electron injection regions. A myriad of other patterns are possible and may provide almost any desired shapes and percentage coverage of P and N-type materials. For example, the conductivity types of materials of the patterns of FIGS. 7A and 7B could be reversed. Any shape of patterned regions may be possible, but in general electron injection regions covering about 5% to 25% of the active device area may be desirable in an RC IGBT. Such patterns may be formed as described above, e.g., by patterned implantation and diffusion of one conductivity type of impurities in the front side of a substrate of the opposite conductivity type or by patterned sputtering. The back side may then be ground or etched to form a planar surface exposing different regions having opposite conductivity types.

Figure 8:
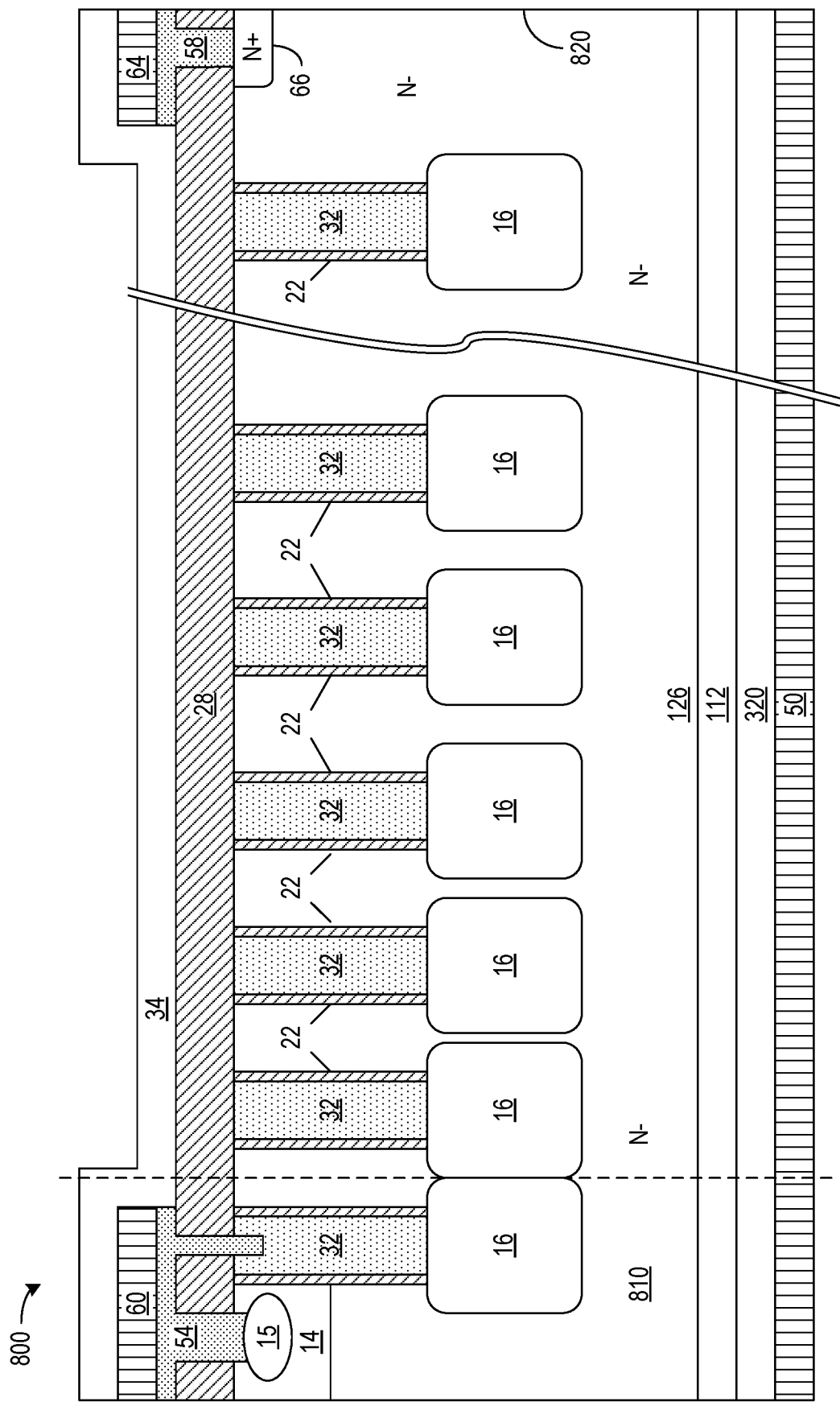
FIG. 8 shows a cross-sectional view of a high voltage edge termination for a field stop IGBT.

FIG. 8 shows a high voltage (HV) termination structure 800 of a field stop IGBT. HV termination structure 800 that may extend around the perimeter of an IGBT die. HV termination structure 800 includes buried field shield rings 16 under trenches containing dielectric trench side wall spacers 22 filled with P-type polysilicon 32 as buried field plates. The portion of HV termination structure 800 shown in FIG. 8 starts from an active device area 810 including a P body region 14 contacted by an emitter electrode 60 through a metal interconnect 54 and a highly-doped P body contact region 15. Metal interconnect 54 may also connect emitter electrode 60 to one or more shield ring including P polysilicon 32 and underlying buried field ring 16. During use, spaces of drift region 126 between buried P-type field rings 16 divide the applied emitter voltage between the buried rings 16 along the edges of the IGBT die starting from the active device area 810 and ending just before a saw street 820 at a channel stop region 66. (A metal field plate 64 may electrically connect through an interconnect 58 to an N+ channel stop 66, which serves to prevent depletion from reaching to sawn die edges 820, which could otherwise cause high leakage current during high voltage blocking mode.) The space between buried rings 16 may gradually increase from the active device area 810 towards the saw street at outer device edges 820. P polysilicon 32 forms vertical field plates with each vertical field plate being on top of a corresponding buried P− type field ring 16. P-type poly silicon 32 fills trenches within dielectric side wall spacers 22. The vertical buried P-type polysilicon field plates 32 occupy a small lateral spaces and minimize surface charge sensitivity of the HV termination structure. HV termination structure 800 of FIG. 8 is described for the example of a trench field stop IGBT having a back side structure including a P+ hole injection layer 320 and a collector contact 50. HV termination structure 800 can be alternatively be used with other back side structures such as disclosed herein and for other types of power devices such as power MOSFETs and diodes, in addition to planar and trench IGBTs.

Although particular implementations have been disclosed, these implementations are only examples and should not be taken as limitations. Various adaptations and combinations of features of the implementations disclosed are within the scope of the following claims.

What is claimed is:

1. A method for manufacturing of a vertical Insulated Gate Bipolar Transistor (IGBT) including an injection region of a first conductivity type, comprising:
   epitaxially growing a field stop layer of a second conductivity type on a substrate;
   epitaxially growing a drift region of the second conductivity type on the field stop layer;
   forming one or more IGBT active cells in and on the drift region;
   back-side thinning of a wafer including the IGBT active cells;
   sputtering an injection layer of the first conductivity type on a back-side surface of the wafer, the sputtering using a first silicon target with a known doping concentration; and
   depositing a back-side metal contacting the injection layer.

2. The method of claim 1, wherein the back-side thinning removes the substrate.

3. The method of claim 1, wherein the back-side thinning minimizes a thickness of the substrate under a condition that, to a tolerance of the thinning process, the field stop layer remains intact.

4. The method of claim 1, wherein the back-side thinning comprises grinding and etching.

5. The method of claim 1, wherein depositing the back-side metal comprises:
   depositing a Al:Ti:Ni:Ag or Au composition on the injection layer; and
   sintering the back-side metal at a temperature below 450° C. to improve ohmic contact of the back-side metal to the injection layer.

6. The method of claim 1, wherein growing the drift region comprises:
   epitaxially growing a transition segment of the drift region just above the field stop layer, the transition segment having a first dopant concentration that is lower than a doping concentration of the field stop layer; and
   growing a high voltage segment of the drift region above the transition segment, the high voltage segment having a second dopant concentration that is lower than the first dopant concentration and supports high voltage blocking.

7. The method of claim 1, further comprising:
   patterning the injection layer to remove portions of the injection layer and leave a first patterned region of the first conductivity type on the back-side surface of the wafer;
   sputtering a second sputtered layer having the second conductivity type on a back side of a structure including the first patterned region, the sputtering of the second sputtered layer using a second silicon target with a known doping concentration; and
   removing material from the second sputtered layer to expose the first patterned region and leave a second patterned region in place of the portions of the injection layer removed.

8. The method of claim 7, wherein patterning the injection layer comprises:
   depositing an oxide layer and a photoresist layer on a back side of the injection layer;
   patterning the photoresist layer for masking;
   etching exposed areas of the oxide layer and the injection layer to remove the portions of the injection layer and leave the first patterned region; and
   removing the photoresist layer before sputtering the second sputtered layer.

9. The method of claim 8, wherein removing the material from the second sputtered layer comprises at least one of etching back and chemical mechanical polishing of the oxide layer and the second sputtered layer to completely remove the oxide layer and expose both the first patterned region and the second patterned region at a back side of the resulting structure.

* * * * *